US006410925B1

(12) United States Patent
Armbruster et al.

(10) Patent No.: US 6,410,925 B1
(45) Date of Patent: Jun. 25, 2002

(54) SINGLE TILT ROTATION CRYOTRANSFER HOLDER FOR ELECTRON MICROSCOPES

(75) Inventors: Barbara L. Armbruster, Livermore, CA (US); Jochen K. Böhm, Estenfeld (DE); Rudolf Gatz, München (DE); Stephan Nickell, Rüdenau (DE); Ronald Zolkowski, Pittsburgh, PA (US)

(73) Assignee: Gatan, Inc., Pleasanton, CA (US)

( * ) Notice: Subject to any disclaimer, the term of this patent is extended or adjusted under 35 U.S.C. 154(b) by 73 days.

(21) Appl. No.: 09/629,586

(22) Filed: Jul. 31, 2000

(51) Int. Cl.[7] ................................................ H01J 37/20
(52) U.S. Cl. .................................................. 250/442.11
(58) Field of Search .......................... 250/442.11, 443.1, 250/440.11

(56) References Cited

U.S. PATENT DOCUMENTS 5,192,867 A    3/1993  Osakabe et al.
5,783,830 A  *  7/1998  Hirose et al. ............ 250/492.21

OTHER PUBLICATIONS

Strupp P.G. et al: "A Simple Cryogenic Ultrahigh Vacuum Manipulator Providing Azimuthal Rotation", Journal of Vacuum Science and Technology: Part A, American Institute of Physics, New York, US, vol. 9, No. 4, Jul. 1, 1991, pp. 2410–2411.
Durr H. et al: "A Compact Three–Axis Cryogenic Ultrahigh Vacuum Manipulator", Journal of Vacuum Science and Technology: Part A, American Institute of Physics, New York, US, vol. 8, No. 1, 1990, pp. 145–146.

* cited by examiner

Primary Examiner—Kiet T. Nguyen
(74) Attorney, Agent, or Firm—Killworth, Gottman Hagan & Schaeff, L.L.P.

(57) ABSTRACT

A cryotransfer holder for side entry transmission electron microscopes is provided. The cryotransfer holder design permits a specimen to be rotated about its axis as well as tilted while being maintained at a low temperature. The holder allows two sets of tilt data, preferably perpendicular to one another, to be collected from a single frozen specimen.

8 Claims, 2 Drawing Sheets

SINGLE TILT ROTATION CRYOTRANSFER HOLDER FOR ELECTRON MICROSCOPES

BACKGROUND OF THE INVENTION

1. Field of Invention

The present invention relates to side entry specimen cryotransfer holders for transmission electron microscopy and particularly to cryoholders capable of rotating the specimen in the plane of the specimen and tilting that specimen around the electron beam axis.

2. Description of Prior Art

Electron microscope specimen holders may either take the form of a cartridge or a rod. Cartridge type holders are inserted vertically into the microscope through the upper polepiece of the objective lens, whereas rod type holders are inserted horizontally through the side of the microscope between the upper and lower polepieces. In recent years, rod type holders have become more widely used because mechanisms for tilting the specimen are simpler and more reliable. The ability to tilt a specimen is important for stereo imaging, three dimensional reconstruction, and tuning for optimum diffraction conditions.

Rod type specimen holders have also become the preferred type for observation of specimens at low temperatures. This is because the extraction of heat from the specimen is easily accomplished by forming the specimen tip of a thermally conductive material such as copper and extending the tip in the form of a copper rod to a dewar of liquid nitrogen or helium mounted at the other end of the rod. Cryotransfer holders are a more recent development of the rod type cooling holders in which specimens can be transferred at low temperature into the microscope from an external cryostation without frosting of the specimen.

Conventional resin embedding methods for biological samples have been shown to produce readily identifiable artifacts that can be interpreted in reference to structures observed in living cells. Water must be removed from specimens during resin embedment, causing diffusion artifacts and collapse of delicate structures. For these and other reasons, many laboratories use ultra-rapid freezing technologies to prepare biological specimens for examination in the transmission electron microscope. While this approach has many advantages, several technical problems must be surmounted; the specimen must be rapidly frozen to promote the formation of amorphous ice, and the sample must be maintained at temperatures below −140° C. to prevent devitrification.

Cryotransfer holders have been designed to maintain specimens in a frozen state and to prevent frost deposition on specimens during the transfer of the holder from a workstation into the microscope. Typically, when the specimen has been clamped into the holder, a cryo-shutter is moved to completely cover the specimen while being transferred. An example of this type of cryotransfer holder is described in Swann et al, U.S. Pat. No. 4,703,181. Once inserted into the microscope, the shutter is retracted to expose the frozen specimen. Depending on the type of specimen examined, the holder can require tilting to present the most advantageous aspect for recording. The cryoshutter can be replaced over the specimen if the specimen is destined for reexamination at a later date.

As the resolving power of electron microscopes has improved, efforts to resolve high resolution structures of biological organelles and macromolecules have been attempted. Three-dimensional electron microscopic imaging, or electron tomography, is one of the methods employed to gather detailed volume and surface data. This technique involves the reconstruction of individual objects from projection data collected over a large range of specimen tilts. An example of a cryotransfer holder which is useful in electron tomography is described in Swann, U.S. Pat. No. 5,753,924. A low resolution data set would include images of a specimen through a single tilt range of ±70° at 1° intervals. Ideally an object should be tilted ±90°, but current microscope design does not permit this range of movement.

Thus, practical limitations of tomography are set by the damage a specimen suffers with repeated irradiation and the range of specimen tilt available to generate projection data. To address the problem of specimen damage from repeated irradiation, samples are examined at low temperature in a cryoholder. The tilt range of a specimen could be extended by tilting the specimen in a second axis perpendicular to the first as is done with a double tilt holder. An example of a commercially-available double tilt holder is the Model 915 Double Tilt Cryotransfer System from Gatan, Inc., Pleasanton, Calif. For most double tilt holders, the tilt range of the second axis is limited to up to ±45° by the construction of the specimen cradle or the method by which tilting through the second axis is achieved. A data set including ±70° data in the first axis and ±45° in the second axis of tilt is not ideal. The specimen cannot be removed from the microscope and manually reoriented after one set of tilt data is taken because there is a high probability that the specimen will melt and become damaged or contaminated during this manipulation.

As discussed above, if a conventional single tilt cryotransfer holder is used to collect a tomographic series, current data sets typically cover a range up to ±70° of tilt through a single axis. When used for applications requiring high tilt such as tomography, this limited tilt range prohibits obtaining the necessary images for three-dimensional reconstruction of a specimen's top and bottom surfaces. This comprises roughly one-third of the data set for the structure being examined, while ideally for a single tilt axis stage, a complete data set from ±90° is needed to minimize directional distortions. However, this is impossible with currently-available cryotransfer holders.

In a known cryotransfer holder, designed and manufactured by Gatan Inc., a frozen specimen on a standard circular 3 mm diameter grid may be transported from a cryostation to the transmission microscope for examination. The cryoholder is designed to maintain a specimen at a temperature of less than −160° C. at all times. The specimen tip is configured to produce a primary axis tilt of ±70° in a microscope polepiece gap with a "Z" axis distance of 3 mm or larger from the centerline of the holder to the nearest contacting surface. The tip of the specimen rod contains a moveable cryo-shutter which prevents frost formation on the specimen during transfer from a workstation to the microscope. The cryoshutter is manipulated at will by means of a manual control positioned outside of the holder. The specimen grid is held in place by a specimen clamping device, for example, a Clipring (trademark of Gatan, Inc.).

Accordingly, the need still exists in this art for a cryotransfer holder which is capable of acquiring tilt data at high angles at more than one specimen orientation without disturbing the frozen specimen.

SUMMARY OF THE INVENTION

The present invention meets that need by providing a cryotransfer holder which takes advantage of the design features of the standard cryotransfer holders, including a moveable cryoshutter, maintaining a specimen temperature of less than −160° C., and secure specimen clamping, but which also is capable of acquiring tilt data at high angles at more than one specimen orientation without disturbing the frozen specimen (i.e., without removing the specimen from the microscope). The present invention adds the ability to rotate the specimen in the plane of the specimen at cryotemperatures during observation in the microscope which extends the useful maximum tilt range of the holder through another tilt axis, ideally perpendicular to the original axis.

In accordance with one aspect of the present invention, a side-entry specimen cryoholder for an electron microscope is provided and includes a specimen holder including a specimen cradle having a specimen grid adapted to carry a specimen to be analyzed; a translation mechanism for rotating the specimen cradle within the specimen holder in the plane of the specimen; a mechanism for tilting the specimen cradle; and a cryoshutter which is adapted to protect the specimen during cryotransfer and moveable from a first position covering the specimen to a retracted position. Preferably, the translation mechanism includes an actuation mechanism which is operable externally of the electron microscope. Also preferably, the specimen cryoholder includes a source of cooling.

In a preferred embodiment of the invention, the translation mechanism comprises a motion exchange mechanism linked to the specimen cradle and a translation shaft linked to the motion exchange mechanism. The translation shaft preferably comprises a rod having first and second ends and extending along the long axis of the specimen holder, with the first end of the rod being connected to the motion exchange mechanism and the second end adapted to extend outside the transmission electron microscope. In one embodiment, the motion exchange mechanism comprises a toothed rack communicating with corresponding toothed gears on the periphery of the specimen cradle. The cryoholder further includes a knob threadably connected to the specimen holder, with the second end of the translation shaft being coupled linearly to the knob such that rotation of the knob causes linear movement of the translation shaft.

A sliding vacuum seal communicating with the translation shaft is also provided such that the vacuum inside the transmission electron microscope is maintained during movement of the motion exchange mechanism. The cryoshutter also includes a pin connected therewith such that linear movement of the translation mechanism engages the pin and causes the cryoshutter to move from the first position covering the specimen to a retracted position. The source of cooling preferably comprises a dewar of liquid nitrogen connected to the specimen holder by a thermally insulated conductor.

In operation, the specimen cryoholder is inserted into an electron microscope and the translation mechanism is actuated to retract the cryoshutter. A first set of data is taken with the specimen in a first orientation and the specimen cradle tilted through approximately ±70°. Then, the specimen is rotated, preferably 90° in the plane of the specimen using the motion exchange mechanism, and a second set of tilt data is taken through approximately ±70°. This procedure adds a second set of tilt data to compensate for information which would otherwise be missing from prior art specimen holders unless the holder were removed from the microscope and the specimen manually rotated. The present invention facilitates the production of a high resolution reconstruction of the object being studied without further handling of the frozen specimen.

Accordingly, it is a feature of the invention to provide a side-entry cryotransfer holder for electron microscopes that allows a specimen to be rotated in a plane perpendicular to the electron beam axis in a transmission electron microscope without removing the specimen from the microscope. It's a further feature of the invention to provide a rotation mechanism which is activated externally of the microscope. It is yet a further feature of the invention to provide a moveable cryoshutter which protects the specimen during transfer from the specimen loading workstation into a microscope, which also protect regions of the grid when the holder is positioned in the microscope before viewing of the sample, and which is removed prior to a viewing session. These, and other features and advantages of the present invention, will become apparent from the following detailed description, the accompanying drawings, and the appended claims.

BRIEF DESCRIPTION OF THE DRAWINGS

Reference is made by way of example to the drawings in which like elements are represented by like reference numerals and in which.

DETAILED DESCRIPTION OF THE PREFERRED EMBODIMENT

The present invention will be described in detail with respect to its preferred embodiment which is as a side-entry specimen holder for a transmission electron microscope. It will be apparent that the specimen holder may be adapted to operate in other types of electron microscopes as well. Further, the specimen holder of the present invention, in its preferred form, includes cooling (e.g., cryogenic) capabilities. The specimen holder is designed to be inserted into the column of an electron microscope so that the specimen carried thereon may be aligned with an electron beam which traverses the column.

Figure 1:
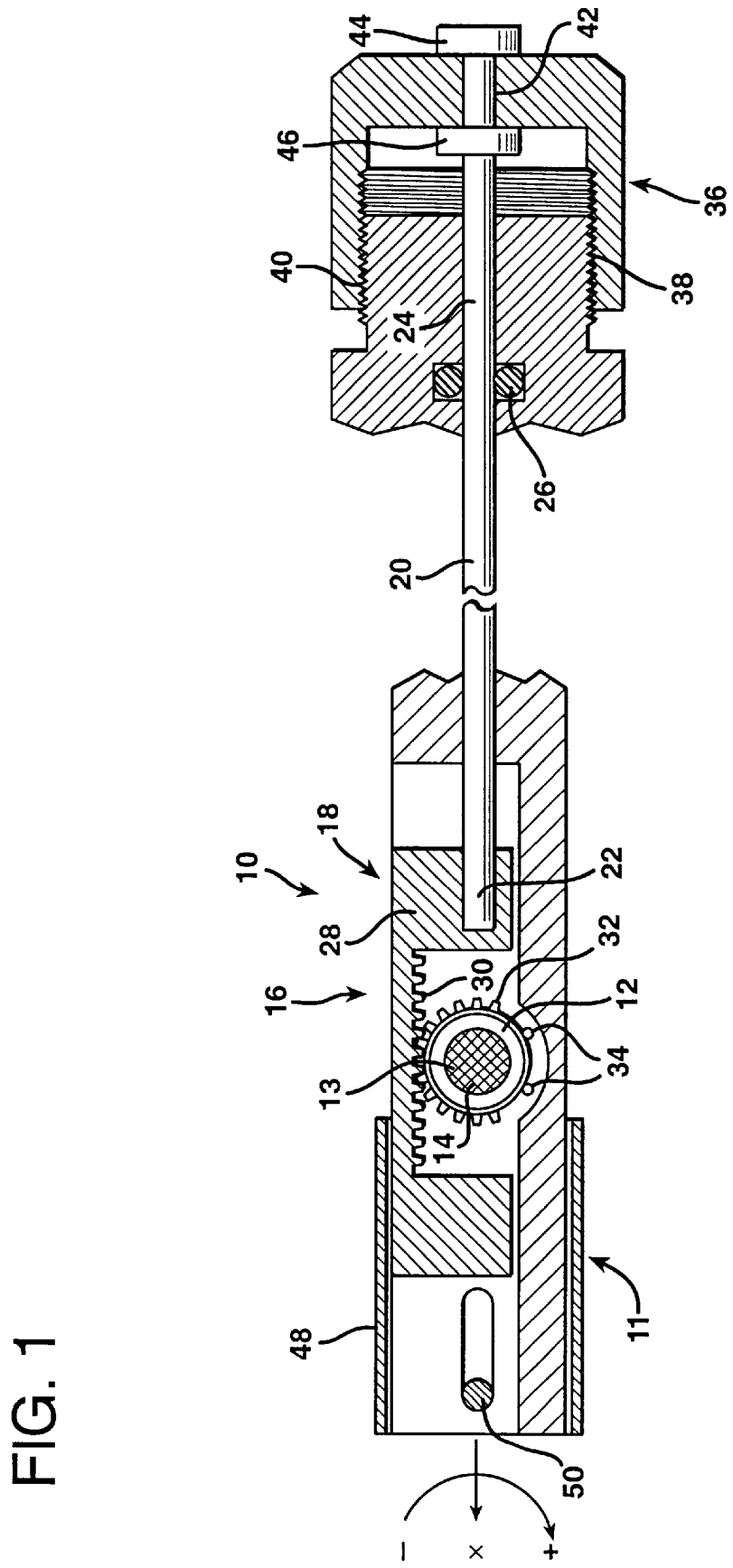
FIG. 1 is a schematic top view, in section, of the side-entry cryotransfer holder, including the moveable cryoshutter, a translation mechanism which rotates the specimen cradle, and an externally operated rotation knob to move the translation mechanism.

For purposes of this invention, and as illustrated in FIG. 1, the X- and Z-axes of movement of the specimen holder are defined as follows. The X-axis refers to the longitudinal axis of specimen holder 10, with movement toward the distal end or tip of specimen holder 10 being defined as the minus (−) direction and movement in the opposite direction being defined as the positive (+) direction. Tilting of the specimen bolder may occur in a first axis (sometimes has referred to as X-axis tilt) in either a clockwise (+) or counterclockwise (−) direction as shown.

Specimen holder 10 may be rotated about the vertical (Z-) axis for a full 360° in either the positive (+) clockwise direction of minus (−) counterclockwise direction. In FIG. 1, the Z-axis is a line perpendicular to the plane of the holder.

As shown in FIG. 1, a distal end or tip 11 of specimen holder 10 includes a specimen cradle 12. As is conventional, frozen specimen 13, which has been previously prepared under cryogenic conditions, is mounted within a recess in the specimen holder tip 11 and secured in cradle 12, for example by a clamping ring or grid 14. The specimen tip is cooled in a conventional manner such as by means of a copper conductor connected to a source of cooling such as a liquid nitrogen dewar (not shown). The specimen cradle 12 is constructed of a rigid material of high thermal conductivity.

Also as shown in FIG. 1, the specimen holder 10 includes a translation mechanism shown generally at 16 for rotating specimen cradle 12 (and specimen 13) about the Z-axis in the plane of the specimen. Translation mechanism 16 is operable externally of the microscope as will be explained in detail below. The translation mechanism includes a motion exchange mechanism, shown generally at 18. In the embodiment illustrated, motion exchange mechanism 18 includes a rack 28 which slides along a recess in holder 10. Rack 28 includes a series of teeth 30 which engage a corresponding series of teeth 32 on cradle 12. Translation shaft 20, which includes a first end 22 and a second end 24, links rack 28 with the external actuation mechanism. The first end 22 of shaft 20 is connected to rack 28, while second end 24 is linearly connected to rotation knob 36.

As shown, knob 36 includes internal threads 38 which mate with corresponding external threads 40 on the specimen holder. Translation shaft 20 extends through an opening 42 in knob 36 and is able to rotate freely in that opening. As shown, the second end 24 of shaft 20 is secured to knob 36 by flanges 44 and 46 so that it is rotationally coupled to knob 36 linearly. When knob 36 is rotated clockwise, for example, the rotary motion is transferred to forward linear motion of shaft 20 and rack 28. Rotating knob 36 in a counterclockwise direction, for example, results in a rearward linear movement of shaft 20 and rack 28. The flat sides of rack 28 mate with surfaces in holder 10 to prevent rack 28 from rotating.

Forward linear movement of rack 28 causes rotation of cradle 12 through the meshing gear teeth 30 (on the rack) and 32 (on cradle 12). Cradle 12 is maintained in proper position by cradle bearing pins 34. Thus, rotation of knob 36 externally of the microscope by an operator cause the linear motion of shaft 20 to be translated into rotary motion of cradle 12. The vacuum in the microscope is maintained by the presence of sliding O-ring vacuum seal 26 which permits linear movement of shaft 20 while maintaining an air-tight seal between holder 10 and the exterior of the microscope. Further, while a manually-actuated mechanism has been described, it will be apparent that a motorized drive mechanism may be substituted.

While motion exchange mechanism 18 has been illustrated by the rack and gear embodiment shown in FIG. 1, it will be apparent to those skilled in this art that other drive mechanisms are possible which would still be within the scope of the invention. For example, manual or motorized control of the motion exchange mechanism could be accomplished using a drive belt, a friction drive, a spherical drive, a ribbon drive, piezo-motors, or mechanical gears.

Referring now again to FIG. 1, a moveable cryoshutter 48 completely surrounds the frozen specimen 13 and is removed from the specimen cradle area by the action of rack 28 pressing against cryoshutter pin 50. Specimen cradle 12 is in close contact with cradle bearing pins 34 on one side and rack 28 with gear teeth 30 on the opposite side. The teeth 30 of rack 28 mesh with corresponding teeth 32 on the outer periphery of specimen cradle 12.

Figure 2:
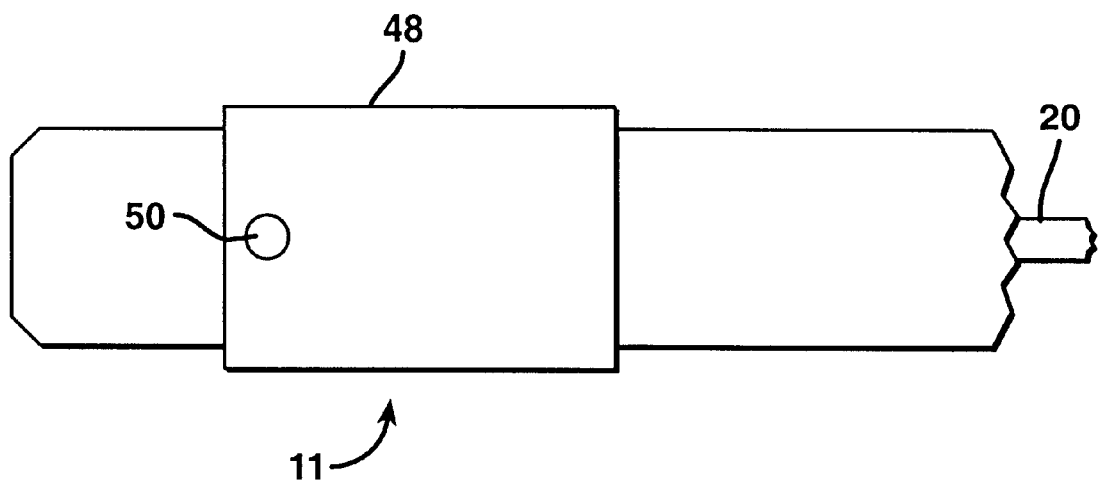
FIG. 2 schematically illustrates the side-entry cryotransfer holder with the cryoshutter completely covering the specimen.

Referring now to FIG. 2, cryoshutter 48 completely surrounds specimen 13 and specimen cradle 12, protecting the frozen specimen from frosting (by exposure to the ambient atmosphere) during transfer into the electron microscope. As one of the last actions before inserting the holder into the electron microscope, the operator manually moves cryoshutter 48 over specimen 13 while holder 10 is maintained at cryotemperatures in a specimen holder workstation. Once inside the microscope, the operator turns rotation knob 36 attached to translation shaft 20 to move rack 28. Linear movement of rack 28 causes it to contact cryoshutter pin 50 and moves cryoshutter 48 in the direction of the specimen tip to expose the specimen. Thus, actuation of knob 36 operates both cryoshutter 48 as well as causing rotation of specimen cradle 12.

Figure 3:
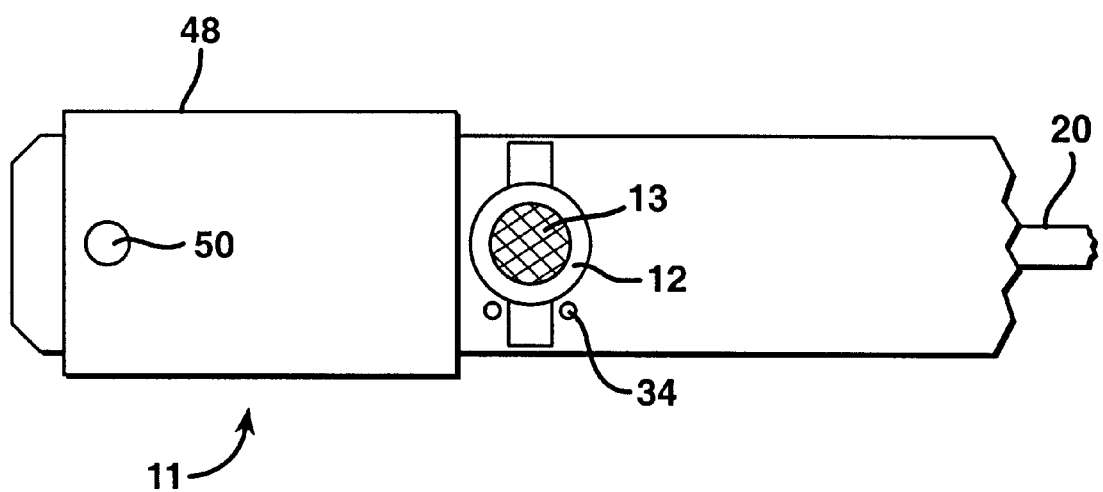
FIG. 3 schematically illustrates the side-entry cryotransfer holder with the cryoshutter actuated to expose the specimen for viewing, tilting, and rotation.

Referring now to FIG. 3, cryoshutter 48 is completely withdrawn to expose the specimen to the electron beam emanating down the microscope column. To rotate the specimen 13 and specimen cradle 12, the operator (or a motor drive) turns rotation knob 36 attached to translation shaft 20 to cause rack 28 to move linearly. Rotational movement of the knob is translated through the meshing teeth 30 of rack 28 and teeth 32 of the specimen cradle 12.

While the above description contains many specific details of structure and operation, one should not construe these as limitations on the scope of the invention but merely as exemplifications of the preferred embodiments thereof. Those skilled in the art will envisage other possible variations within the scope of this invention. For example, the cryoholder could include two drive shafts, one for specimen rotation and one to move the cryoshutter forward to expose the specimen and backwards to protect it during holder insertion and extraction from the microscope. A manual or motorized control of the cryoshutter mechanism using a drive belt, friction drive, piezo-motors or mechanical gears could also be utilized. The moveable cryoshutter could also be moved by a mechanism internal to the microscope.

What is claimed is:

1. A side-entry specimen cryoholder for an electron microscope comprising:
    a specimen holder including a specimen cradle having a specimen grid adapted to carry a specimen to be analyzed;
    a translation mechanism for rotating said specimen cradle within said specimen holder in the plane of said specimen;
    a mechanism for tilting said specimen cradle; and
    a cryoshutter adapted to protect the specimen during cryotransfer and moveable from a first position covering the specimen to a retracted position.

2. A side entry specimen cryoholder as claimed in claim 1 in which said translation mechanism includes an actuation mechanism which is operable externally of said electron microscope.

3. A side entry specimen cryoholder as claimed in claim 2 in which said cryoshutter includes a pin connected therewith such that linear movement of said translation mechanism engages said pin and causes said cryoshutter to move from said first position covering said specimen to a retracted position.

4. A side entry specimen cryoholder as claimed in claim 1 in which said translation mechanism comprises a motion exchange mechanism linked to said specimen cradle and a translation shaft linked to said motion exchange mechanism.

5. A side entry specimen cryoholder as claimed in claim 4 where said translation shaft comprises a rod having first and second ends and extending along a long axis of said specimen holder, said first and of said rod being connected to said motion exchange mechanism and said second end adapted to extend outside said electron microscope.

6. A side entry specimen cryoholder as claimed in claim 5 including a sliding vacuum seal communicating with said translation shaft such that the vacuum inside said electron microscope is maintained during movement of said motion exchange mechanism.

7. A side entry specimen cryoholder as claimed in claim 5 further including a knob threadably connected to said specimen holder, said second end of said translation shaft coupled linearly to said knob such that rotation of said knob causes linear movement of all said translation shaft.

8. A side entry specimen cryoholder as claimed in claim 4 wherein said motion exchange mechanism comprises a toothed rack communicating with corresponding toothed gears on a periphery of said specimen cradle.

* * * * *